United States Patent
Roberts et al.

[11] Patent Number: 5,936,974
[45] Date of Patent: Aug. 10, 1999

[54] CIRCUIT AND METHOD FOR TESTING AN INTEGRATED CIRCUIT

[75] Inventors: Gordon Roberts, Meridian; James E. Miller, Jr.; Eric Stubbs, both of Boise, all of Id.

[73] Assignee: Micron Technology, Inc., Boise, Id.

[21] Appl. No.: 08/918,497

[22] Filed: Aug. 22, 1997

Related U.S. Application Data

[63] Continuation of application No. 08/636,385, Apr. 23, 1996, Pat. No. 5,787,096.

[51] Int. Cl.$^6$ .................................................... G11C 29/00
[52] U.S. Cl. ............................................................. 371/21.1
[58] Field of Search ......................... 371/21.1; 324/73.1, 324/158.1; 380/52; 340/825.31

[56] References Cited

U.S. PATENT DOCUMENTS

| | | | |
|---|---|---|---|
| 4,906,862 | 3/1990 | Itano et al. | 307/296.3 |
| 4,941,174 | 7/1990 | Ingham | 380/52 |
| 4,965,511 | 10/1990 | Nishimura et al. | 324/73.1 |
| 5,019,772 | 5/1991 | Dreibelbis et al. | 324/158 |
| 5,155,704 | 10/1992 | Walther et al. | 365/201 |
| 5,212,442 | 5/1993 | O'Toole et al. | 324/158 |
| 5,231,605 | 7/1993 | Lee | 365/201 |
| 5,245,577 | 9/1993 | Duesman et al. | 365/201 |
| 5,248,075 | 9/1993 | Young et al. | 228/5.1 |
| 5,279,975 | 1/1994 | Devereaux et al. | 437/8 |
| 5,339,320 | 8/1994 | Fandrich et al. | 371/22.1 |
| 5,348,164 | 9/1994 | Heppler | 209/573 |
| 5,367,263 | 11/1994 | Ueda et al. | 324/537 |
| 5,373,472 | 12/1994 | Ohsawa | 365/201 |
| 5,384,533 | 1/1995 | Tokuda et al. | 324/158.1 |
| 5,384,741 | 1/1995 | Haragucyhi | 365/201 |
| 5,391,892 | 2/1995 | Devereaux et al. | 257/48 |
| 5,397,908 | 3/1995 | Dennison et al. | 257/306 |
| 5,420,869 | 5/1995 | Hatakeyama | 371/21.1 |
| 5,426,649 | 6/1995 | Blecha, Jr. | 371/22.1 |
| 5,440,241 | 8/1995 | King et al. | 324/765 |
| 5,440,517 | 8/1995 | Morgan et al. | 365/202 |
| 5,442,642 | 8/1995 | Ingalls et al. | 371/22.5 |
| 5,450,362 | 9/1995 | Matsuzaki | 365/201 |
| 5,452,253 | 9/1995 | Choi | 365/201 |
| 5,457,400 | 10/1995 | Ahmad et al. | 324/763 |
| 5,467,468 | 11/1995 | Koshikawa | 371/22.3 |
| 5,469,393 | 11/1995 | Thomann | 365/201 |
| 5,475,330 | 12/1995 | Watanabe et al. | 327/408 |
| 5,488,583 | 1/1996 | Ong et al. | 365/201 |
| 5,526,364 | 6/1996 | Roohparvar et al. | 371/22.1 |
| 5,528,162 | 6/1996 | Sato | 324/65 |
| 5,528,603 | 6/1996 | Canella et al. | 371/25.1 |
| 5,541,935 | 7/1996 | Waterson | 371/22.5 |
| 5,544,108 | 8/1996 | Thomann | 365/201 |

*Primary Examiner*—Phung M. Chung
*Attorney, Agent, or Firm*—Schwegman, Lundberg, Woessner & Kluth, P.A.

[57] ABSTRACT

A selector circuit (12) for placing a memory device (10) in test mode. The selector circuit (12) uses a logic circuit (26) to determine when a control signal provided to a pin of the memory device (10) maintains a first logic level for a period of time exceeding the specification for the control signal in normal operation. A multiplexer (24) receives the control signal and a substitute control signal at an alternate pin of the memory device. The substitute control signal is used in place of the control signal during the test. The output of the logic circuit (26) is coupled to control the multiplexer (24) to select the control signal for use in addressing a cell of the memory device (10) in normal operation and to select the substitute control signal for use in addressing a cell of the memory device (10) in test mode.

15 Claims, 3 Drawing Sheets

CIRCUIT AND METHOD FOR TESTING AN INTEGRATED CIRCUIT

This application is a continuation of the prior application Ser. No. 08/636,385, filed on Apr. 23, 1996, which is now U.S. Pat. No. 5,787,096.

TECHNICAL FIELD OF THE INVENTION

The present invention relates generally to integrated circuits and, in particular, to a circuit and method for testing an integrated circuit.

BACKGROUND OF THE INVENTION

An integrated circuit comprises a large number of semiconductor devices, such as transistors, that are fabricated on a semiconductor substrate. Integrated circuits are produced in quantity on fabrication lines. Before an integrated circuit is sold, the manufacturer tests the circuit for defects so that corrective action can be taken, if possible. To test the integrated circuit, the manufacturer applies test signals to selected pins of the integrated circuit. To speed up the process of testing large integrated circuits such as memory devices, the signals used to test the integrated circuit differ from the signals used in normal operation, even though the signals in both modes use the same pins of the integrated circuit. Therefore, designers have developed various techniques to differentiate test and normal modes of operation. Because this test mode should not be used once the chip successfully completes the tests, precautions must be taken to assure that the ultimate user of the circuit cannot inadvertently activate the test mode.

In a typical dynamic random access memory (DRAM) device, an out-of-specification voltage, typically 12 volts, is applied to one of the address pins to place the device into test mode for the manufacturer. Once in test mode, the manufacturer can test the operation of the memory device. By using an out-of-specification voltage to enter test mode, it is unlikely that an end user will place the device in test mode inadvertently. As the size of integrated circuits gets smaller, this technique becomes less reliable and the risk of damaging the circuit by shorting out components increases by exceeding the capacity of the circuit to pass current associated with the higher voltage.

In other memory devices, the test circuitry uses a latch circuit to determine when to enter test mode. These devices suffer from the problem that the ultimate user of the device could inadvertently initiate the test mode when turning on a computer that uses the device. Because it is not possible to disable the latch from entering the test state, the latch could be in the test state at power up thus allowing the ultimate user to activate the test circuitry.

For the reasons stated above, and for other reasons stated below which will become apparent to those skilled in the art upon reading and understanding the present specification, there is a need in the art for a circuit and method for entering test mode that reduces the risk of damage to the device and reduces the chances that the ultimate user will inadvertently enter test mode.

SUMMARY OF THE INVENTION

The above mentioned problems with testing of integrated circuits and other problems are addressed by the present invention and which will be understood by reading and studying the following specification. A circuit and method for testing integrated circuits is described which enters test mode based on a control signal that maintains a logic value for a period of time that exceeds the specification for the control signal in the normal operation of the circuit. Advantageously, the circuit and method allow testing of the circuit with reduced risk of shorting out components of the circuit by using control signals with voltage levels that fall within the circuit's normal voltage levels and outside the normal timing of the signals. Further, the control signals used by the circuit and method to enter test mode also reduce the likelihood that test mode will be activated in normal operation by an end user due to differences in the timing of control signals between test mode and normal operation.

In particular, one illustrative embodiment of the present invention provides a selector circuit for placing a memory device in test mode. The selector circuit uses a logic circuit to determine when a control signal provided to a pin of the memory device maintains a first logic level for a period of time exceeding the specification for the control signal in normal operation. A multiplexer receives the control signal and a substitute control signal at an alternate pin of the memory device. The substitute control signal is used in place of the control signal during the test. The output of the logic circuit is coupled to control the multiplexer to select the control signal for use in addressing a cell of the memory device in normal operation and to select the substitute control signal for use in addressing a cell of the memory device in test mode.

In another embodiment, the logic circuit comprises a delay circuit coupled to receive and delay the control signal. Further, a logic gate receives the output of the delay and the control signal so as to produce an output signal that indicates when the control signal is in the first logic state for a period of time that exceeds the specification for normal operation of the memory device.

Another embodiment of the present invention includes a memory device that includes an enabling circuit coupled with the logic circuit to control the multiplexer. The enabling circuit receives at least one additional control signal that enables the selector to determine when to enter test mode.

In another embodiment, the enabling circuit further includes a feedback loop that locks out the effect of the enabling circuit once the selector circuit selects the test mode.

In another embodiment, the selector circuit receives the substitute control signal at an address pin that is not used to provide address information during a test in test mode.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
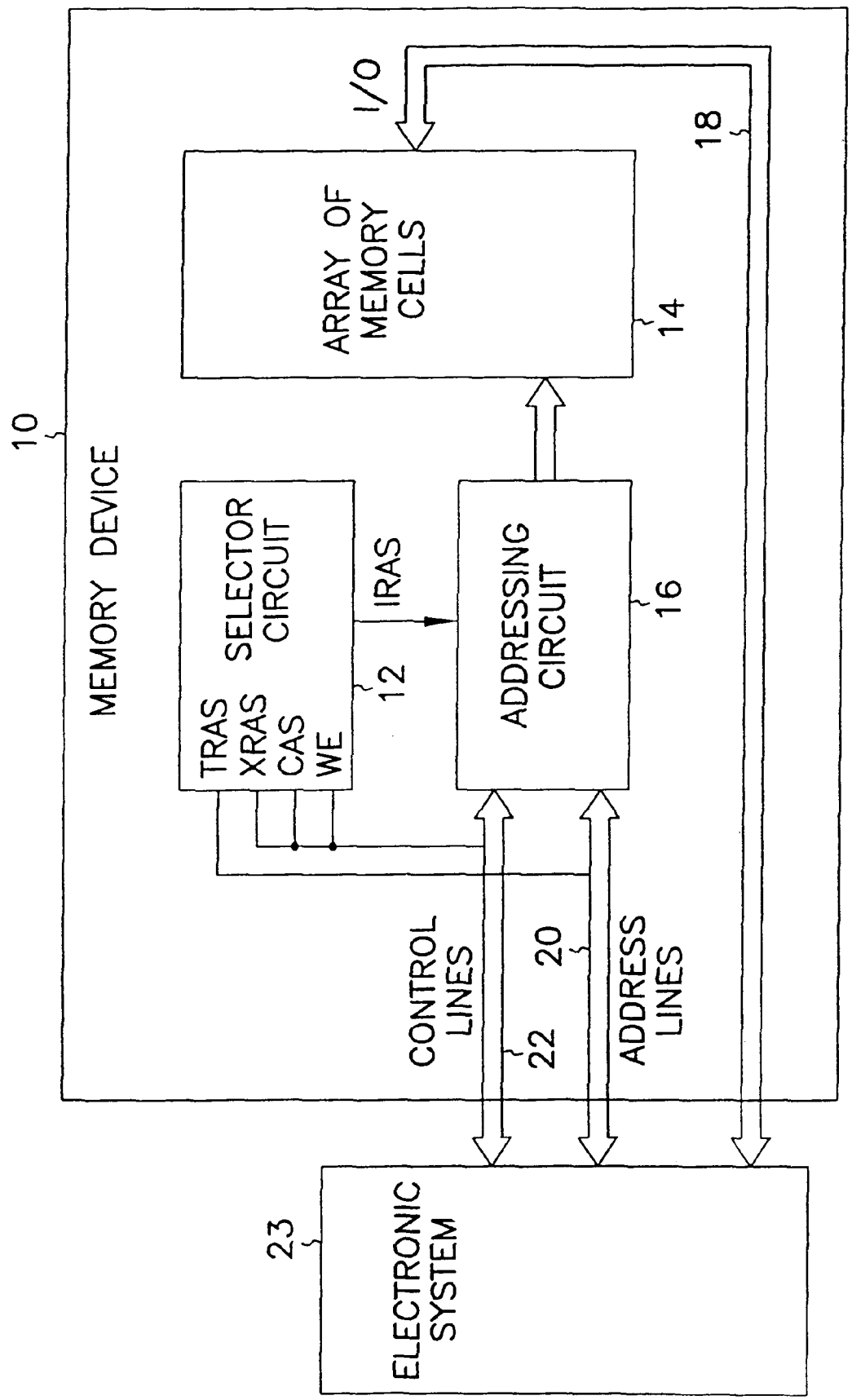
FIG. 1 is a block diagram of an illustrative embodiment of the present invention.

FIG. 1 is a block diagram of an illustrative embodiment of the present invention. Memory device 10 includes selector circuit 12 that switches memory device between a normal operation mode and one or more test modes. Advantageously, selector circuit 12 responds to a signal that triggers the test mode of memory device 10 that does not risk shorting out components of memory device 10 despite the continued decrease in size of the components. Further, memory device 10 is designed such that in normal operation by an end user, memory device 10 will not inadvertently enter test mode.

Memory device 10 includes array of memory cells 14 constructed as known to a person of ordinary skill in the art. For example, memory device 10 may comprise a dynamic random access memory device (DRAM) or other appropriate integrated circuit. Addressing circuit 16 is coupled to array 14. Array 14 provides and receives data over input/output (I/O) lines 18. Further, address lines 20 are coupled to addressing circuit 16 to provide the address of a cell in array 14 to be accessed for reading or writing data. Control lines 22 are also coupled to addressing circuit 16 to provide signals for controlling the operation of memory device 10. Control lines 22, address lines 20 and input/output lines 18 include pins of memory device 10 that are coupled to electronic system 23.

Selector circuit 12 is coupled to receive a plurality of control signals from control lines 22 and address lines 20. In this embodiment, selector circuit 12 receives two row address strobe signals. The first row address strobe signal is the signal from electronic system 23, such as a processor based computer or other appropriate device. Alternatively, electronic system 23 may comprise a test circuit that provides signals to memory device 10 to test its operation. The first row address strobe is used in normal operation to latch in the row address for a cell to receive data from or provide data to electronic system 23. This signal is labeled "XRAS". Selector circuit 12 also receives a row address strobe signal for use in test mode that is labeled "TRAS". Selector circuit 12 is coupled to provide the appropriate row address strobe signal to addressing circuit 16 to be used to latch a row address in test and normal operation modes.

In operation, memory device 10 receives control signals at control lines 22 to operate in either normal operation mode or in one or more test modes. Selector circuit 12 selects between TRAS for test mode and XRAS for normal operation based on at least one control signal, including XRAS, from control lines 22. For example, selector circuit 12 places memory device 10 in test mode when XRAS transitions to a low logic level and maintains the low logic level for a period of time that exceeds the specification for XRAS in the normal operation mode. For example, selector circuit 12 can place memory device 10 in test mode when XRAS provides a low logic value for at least 1 millisecond or other appropriate time period based on the manufacturers specification for the row address strobe signal.

As a further precaution to prevent an end user from inadvertently entering test mode, selector circuit 12 can base the decision on the state of additional control signals. In the embodiment of FIG. 1, selector circuit 12 uses write enable (WE) and column address strobe (CAS) to determine whether memory device 10 is in test mode. For example, selector circuit 12 can pass TRAS when write enable and column address strobe signals change to low logic values before XRAS goes low. Once in test mode, signals are applied to control lines 22, address lines 20 and input/output lines 18 to test the cells of array 14 using conventional test schemes as known to a person of ordinary skill in the art. The signal used for TRAS is applied to an unused address pin. Alternatively, TRAS can be provided to another appropriate pin of memory device 10 such as a pin not used in the normal operation of memory device 10.

Figure 2:
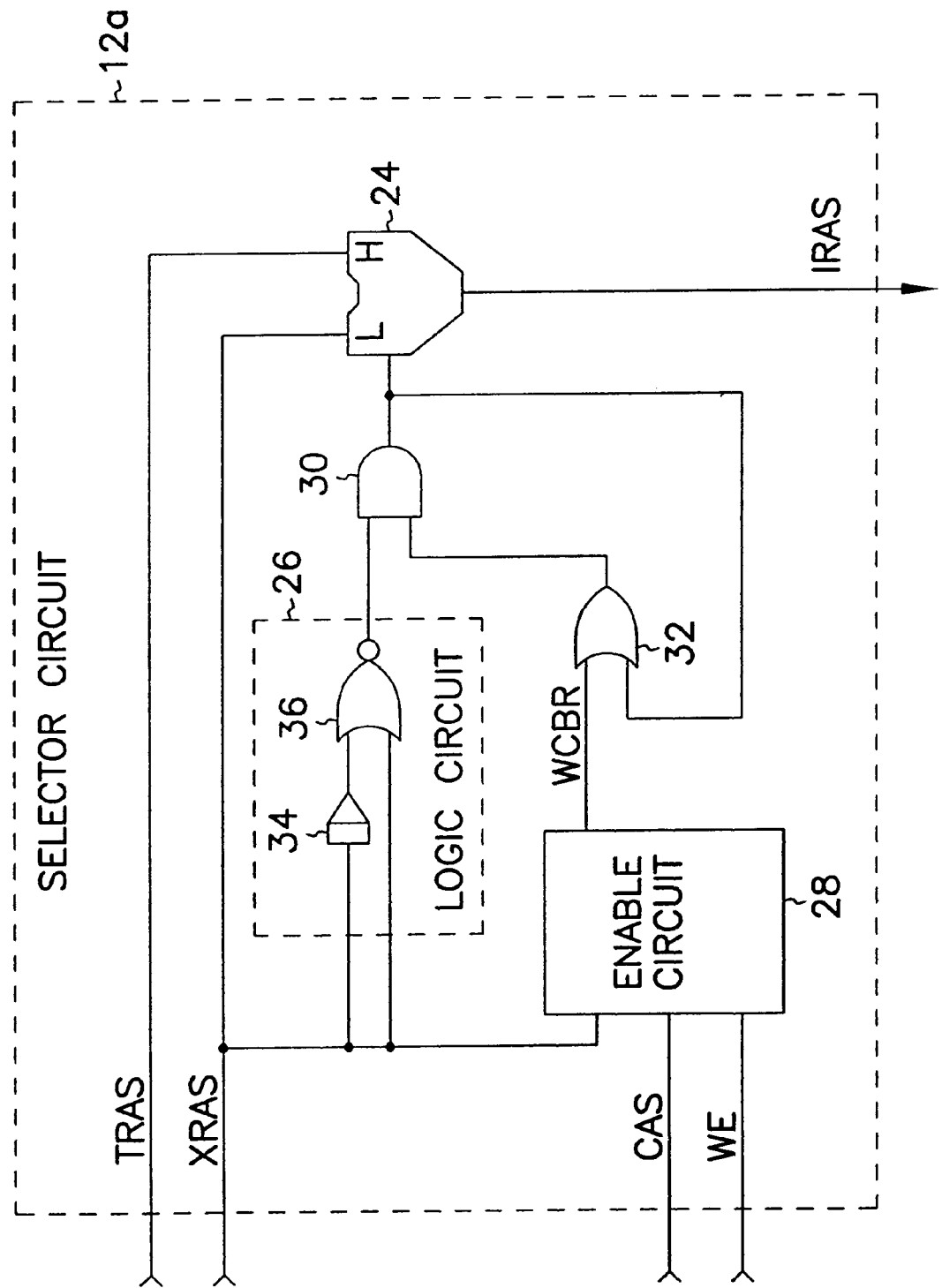
FIG. 2 is a block diagram of an illustrative embodiment of a selector circuit for use in the embodiment of FIG. 1.

FIG. 2 is a block diagram of an illustrative embodiment of a selector circuit 12a for use in memory device 10 of FIG. 1. Selector circuit 12a includes a multiplexer 24 that is coupled to receive the two row address strobe signals, TRAS and XRAS. A selector input of multiplexer 24 is controlled by logic circuit 26 and enabling circuit 28 through AND-gate 30 and OR-gate 32. Specifically, enable circuit 28 is coupled to receive three control signals, namely, XRAS, CAS, and WE. Enable circuit 28 produces a signal, labeled WCBR, and provides this signal to a first input of OR-gate 32. Logic circuit 26 is coupled to receive XRAS as an input and to provide an output to a first input of AND-gate 30. Further, OR-gate 32 provides the second input to AND-gate 30. The output of AND-gate 30 is coupled to the selector input of multiplexer 24 and as a feedback signal to a second input to OR-gate 32.

Logic circuit 26 determines when the XRAS signal maintains a low logic level for a period of time exceeding the specification for normal operation of memory device 10. Logic circuit 26 comprises delay circuit 34 and NOR-gate 36, each coupled to receive the XRAS signal. A second input of NOR-gate 36 is coupled to the output of delay circuit 34. The delay period for delay circuit 34 is chosen such that logic circuit 26 detects when XRAS provides a low logic value for a period of time exceeding the specification for normal operation of memory device 10. In one embodiment, delay circuit 34 delays its input by 1 millisecond. Other values for delay circuit 34 can be chosen for a specific application based on the specified duration of the control signal in normal operation. It is understood that the delay time necessary will vary as manufacturers change specifications for the control signal of a memory device. Delay circuit 34 may comprise a conventional delay circuit constructed as known to a person of ordinary skill in the art.

In operation, selector circuit 12 a selects between providing XRAS and TRAS based on the current mode of operation of memory device 10. Selector 12a enables test mode operation based on a signal from enable circuit 28. Enable circuit 28 outputs a low logic value unless WE and CAS transition low before XRAS. Referring to FIGS. 3A through 3E, this condition is met at time $t_2$ because both CAS and WE changed to low logic values at $t_1$ and XRAS changed to a low logic level at $t_2$. Thus, enable circuit 28 transitions to a high logic value at $t_2$.

Figure 3A:
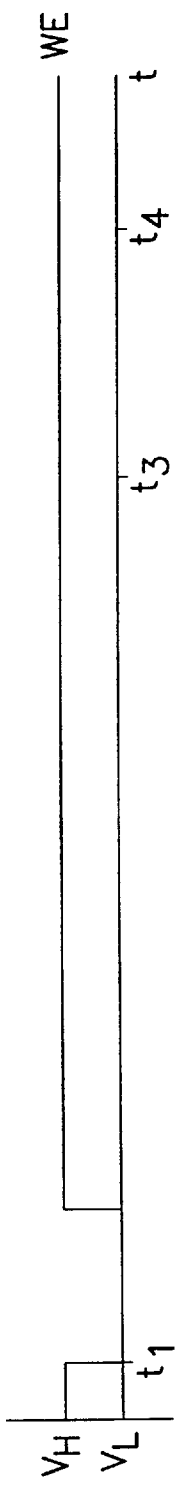
FIGS. 3A through 3E are timing diagrams illustrating the operation of the embodiment of FIG. 1.
Figure 3B:
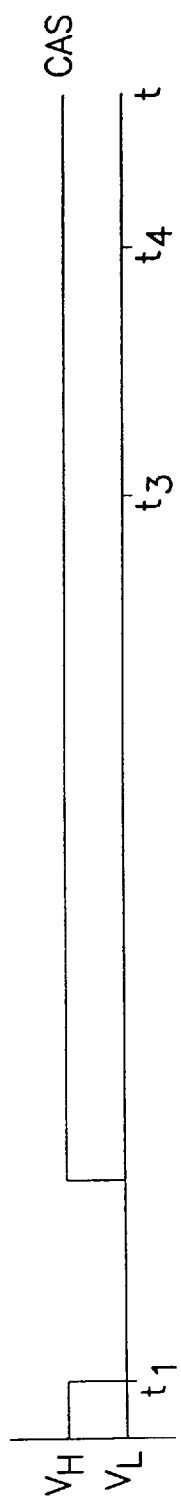
Figure 3C:
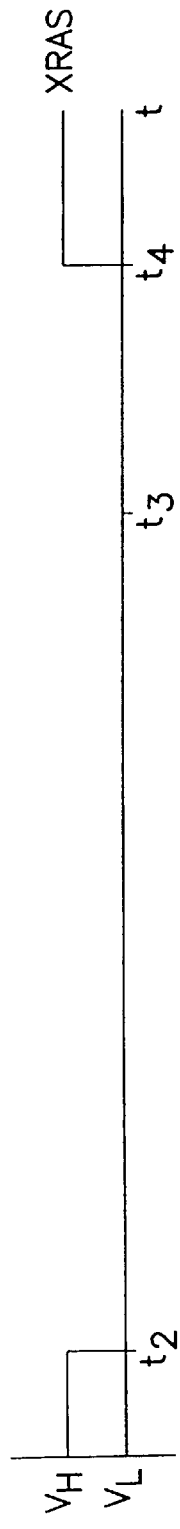
Figure 3D:
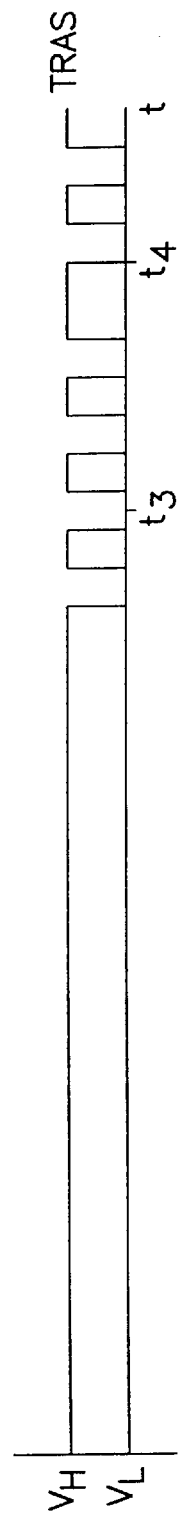
Figure 3E:
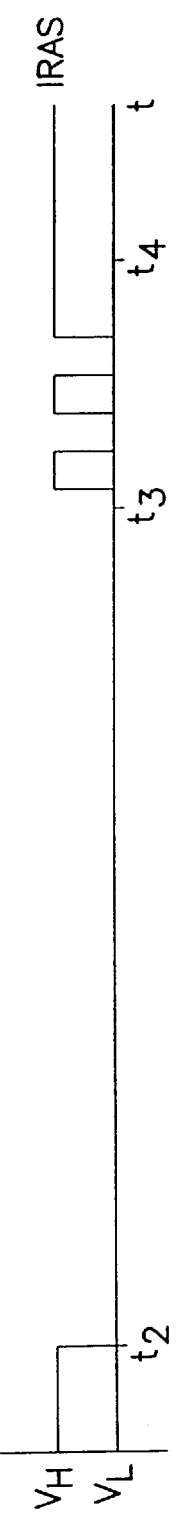

To complete the transition to test mode, logic circuit 26 determines when a low logic level of the XRAS signal exceeds the specification for XRAS in normal operation. At time $t_2$, XRAS goes low. At time $t_3$, XRAS has been low for a period of time that exceeds the specification for normal operation of XRAS based on the delay of delay circuit 34. Thus, both inputs of NOR-gate 36 receive low logic inputs and the output of NOR-gate 36 changes to a high logic output. AND-gate 30 receives the high logic output of both NOR-gate 36 and OR-gate 32 and produces a high logic output. The output of AND-gate 30 selects TRAS to be passed by multiplexer 24 as IRAS as shown in FIG. 3E. It is noted that the output of AND-gate 30 is fed back to the input of OR-gate 32 such that once test mode is entered, OR-gate 32 will provide a high logic value to AND-gate 30.

Thus, the effect of enable circuit 28 is locked out once test mode is entered.

Logic circuit 26 controls the return to normal operation in memory device 10. At time $t_4$, XRAS returns to a high logic value. NOR-gate 36 changes to output a low logic value to AND-gate 30. AND-gate 30 produces a low logic output and multiplexer 24 passes XRAS as IRAS and memory device 10 operates in normal mode.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, a signal other than row address strobe can be used to select test mode. Further, logic circuit 26 and enable circuit 28 can be modified such that multiplexer 24 selects TRAS on a low logic value instead of the high logic value as shown. The selector circuit can also be used with memory devices other than dynamic random access memory devices. Further, the circuit described can be modified within the scope and teachings of the present invention to work with control signals that are active high. Further, selector circuit 12 can receive additional control signals to select between more than one test modes.

What is claimed is:

1. A method for initiating test mode for testing the operation of a multi-pin memory device which has a signal timing specification for a control signal during normal operation, the method comprising:

providing the control signal to a pin of the memory device with a first logic level for a period of time exceeding the specification for the control signal applied to the pin in normal operation; and providing a substitute for the control signal to an alternate pin of the memory device for use in place of the control signal during the test.

2. The method of claim 1, and further comprising the step of selecting between the control signal and the substitute control signal based on the output of a logic circuit.

3. The method of claim 1, and further comprising the step of using at least one additional control signal to enable the memory device to enter a test mode when the control signal enters the first logic state for a period of time exceeding the specification of the memory device.

4. The method of claim 3, wherein using at least one control signal to enable the memory device comprises bringing a write enable signal and a column address strobe signal to a low logic level before bringing a row address strobe signal to a low logic level.

5. The method of claim 1, wherein providing the control signal to the pin of the memory device comprises providing a row address strobe signal to a dynamic random access memory device having a low logic value for a period of time that exceeds the specification for normal operation of the memory device.

6. The method of claim 1, and further comprising exiting the test mode by returning the control signal to its original logic level.

7. The method of claim 1, wherein providing a control signal to a pin of the memory device comprises providing a control signal to a pin of the memory device that maintains a first logic level for a period of time on the order of at least one millisecond.

8. A test mode selector circuit for a multi-pin memory device having a control signal with a signal timing specification for a control signal during normal operation, the selector circuit comprising:

means for detecting when the control signal maintains a logic level for a period of time that exceeds the timing specification for normal operation;

means, responsive to the means for detecting, for selecting between the control signal and a substitute control signal applied to an alternate pin of the memory device to be used in place of the control signal during test mode.

9. The test mode selector circuit of claim 8 wherein the means for detecting comprises a logic circuit that uses a delay and a NOR gate to detect when the control signal maintains a low logic level for a period of time that exceeds the specification for normal operation.

10. The test mode selector circuit of claim 8, wherein the means for selecting comprises a multiplexer.

11. The test mode selector of claim 10, wherein the multiplexer receives the control signal and the substitute controls signals from an external circuit as first and second inputs.

12. The test mode selector of claim 8, wherein the means for selecting is coupled to receive the substitute control signal from an address pin of the memory device.

13. The test mode selector of claim 8, and further including means, coupled to the means for selecting, for enabling the test mode selector.

14. The test mode selector of claim 13, wherein the means for enabling receives column address strobe, row address strobe and write enable signals from an external circuit.

15. The test mode selector of claim 13, wherein the means for enabling includes means for locking out the effect of the enabling circuit upon entering test mode.

* * * * *